US008643147B2

(12) United States Patent
Jeng et al.

(10) Patent No.: US 8,643,147 B2
(45) Date of Patent: *Feb. 4, 2014

(54) SEAL RING STRUCTURE WITH IMPROVED CRACKING PROTECTION AND REDUCED PROBLEMS

(75) Inventors: Shin-Puu Jeng, Hsin-Chu (TW); Shih-Hsun Hsu, Hsin-Chu (TW); Shang-Yun Hou, Jubei (TW); Hao-Yi Tsai, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 561 days.

This patent is subject to a terminal disclaimer.

(21) Appl. No.: 11/933,931

(22) Filed: Nov. 1, 2007

(65) Prior Publication Data
US 2009/0115024 A1 May 7, 2009

(51) Int. Cl.
*H01L 23/544* (2006.01)

(52) U.S. Cl.
USPC .... 257/620; 257/544; 257/750; 257/E23.067; 438/465

(58) Field of Classification Search
USPC .......... 257/499, 620, 698, 758, E23.001, 544, 257/774, 750, E23.067; 438/618, 465
See application file for complete search history.

(56) References Cited

U.S. PATENT DOCUMENTS

| 4,364,078 A | 12/1982 | Smith |
| 4,835,592 A | 5/1989 | Zommer |
| 5,047,711 A | 9/1991 | Smith et al. |
| 5,096,855 A | 3/1992 | Vokoun, III |
| 5,136,364 A | 8/1992 | Byrne |
| 5,206,181 A | 4/1993 | Gross |
| 5,239,191 A | 8/1993 | Sakumoto et al. |
| 5,285,082 A | 2/1994 | Axer |
| 5,371,411 A | 12/1994 | Hara et al. |
| 5,391,920 A | 2/1995 | Tsuji |

(Continued)

FOREIGN PATENT DOCUMENTS

| CN | 1542505 A | 11/2004 |
| CN | 1701418 A | 11/2005 |

(Continued)

OTHER PUBLICATIONS

Pidin, S., et al., "MOSFET Current Drive Optimization Using Silicon Nitride Capping Layer for 65-nm Technology Node," 2004 Symposium on VLSI Technology Digest of Technical Papers, IEEE, Jul. 2004, pp. 54-55.

(Continued)

*Primary Examiner* — Eugene Lee
*Assistant Examiner* — Fang-Xing Jiang
(74) *Attorney, Agent, or Firm* — Slater & Matsil, L.L.P.

(57) ABSTRACT

An integrated circuit structure includes a lower dielectric layer; an upper dielectric layer over the lower dielectric layer; and a seal ring. The seal ring includes an upper metal line in the upper dielectric layer; a continuous via bar underlying and abutting the upper metal line, wherein the continuous via bar has a width greater than about 70 percent of a width of the upper metal line; a lower metal line in the lower dielectric layer; and a via bar underlying and abutting the lower metal line. The via bar has a width substantially less than a half of a width of the lower metal line.

13 Claims, 18 Drawing Sheets

(56) References Cited

U.S. PATENT DOCUMENTS

| | | |
|---|---|---|
| 5,559,362 A | 9/1996 | Narita |
| 5,751,065 A | 5/1998 | Chittipeddi et al. |
| 5,831,330 A | 11/1998 | Chang |
| 5,834,829 A | 11/1998 | Dinkel et al. |
| 5,892,284 A | 4/1999 | Asano |
| 6,022,791 A | 2/2000 | Cook et al. |
| 6,114,766 A | 9/2000 | Shields |
| 6,121,677 A | 9/2000 | Song et al. |
| 6,284,657 B1 | 9/2001 | Chooi et al. |
| 6,300,223 B1 | 10/2001 | Chang |
| 6,350,622 B2 | 2/2002 | Misewich et al. |
| 6,358,839 B1 | 3/2002 | Li et al. |
| 6,365,958 B1 | 4/2002 | Ibnabdeljalil et al. |
| 6,372,409 B1 | 4/2002 | Yu |
| 6,384,463 B1 | 5/2002 | Miles et al. |
| 6,483,173 B2 | 11/2002 | Li et al. |
| 6,492,716 B1 | 12/2002 | Bothra et al. |
| 6,495,918 B1 | 12/2002 | Brintzinger |
| 6,521,975 B1 | 2/2003 | West et al. |
| 6,566,736 B1 | 5/2003 | Ogawa et al. |
| 6,605,861 B2 | 8/2003 | Toyoda |
| 6,796,024 B2 | 9/2004 | Katoh et al. |
| 6,806,168 B2 | 10/2004 | Towle et al. |
| 6,841,455 B2 | 1/2005 | West et al. |
| 6,861,754 B2 | 3/2005 | Lin et al. |
| 6,861,755 B2 | 3/2005 | Hosoda et al. |
| 6,876,062 B2 | 4/2005 | Lee et al. |
| 6,876,064 B2 | 4/2005 | Matumoto et al. |
| 6,876,946 B2 | 4/2005 | Yasuda et al. |
| 6,939,736 B2 | 9/2005 | Grabham et al. |
| 6,963,389 B2 | 11/2005 | Fukada |
| 6,998,712 B2 * | 2/2006 | Okada et al. ............... 257/758 |
| 7,042,099 B2 | 5/2006 | Kurashima et al. |
| 7,087,452 B2 | 8/2006 | Joshi et al. |
| 7,126,225 B2 | 10/2006 | Su et al. |
| 7,126,255 B2 | 10/2006 | Yamaguchi et al. |
| 7,129,565 B2 | 10/2006 | Watanabe et al. |
| 7,129,566 B2 | 10/2006 | Uehling et al. |
| 7,135,384 B2 | 11/2006 | Takyu et al. |
| 7,138,297 B2 | 11/2006 | Iijima et al. |
| 7,138,700 B2 | 11/2006 | Tomita et al. |
| 7,145,211 B2 | 12/2006 | Mallikarjunaswamy et al. |
| 7,235,834 B2 | 6/2007 | Fukada |
| 7,235,864 B2 | 6/2007 | Lee |
| 7,259,445 B2 | 8/2007 | Lau et al. |
| 7,291,874 B2 | 11/2007 | Hsu |
| 7,294,937 B2 | 11/2007 | Su et al. |
| 7,335,577 B2 | 2/2008 | Daubenspeck et al. |
| 7,387,950 B1 | 6/2008 | Kuo et al. |
| 7,400,028 B2 | 7/2008 | Tomita |
| 7,407,835 B2 | 8/2008 | Chuang |
| 7,453,128 B2 | 11/2008 | Tsutsue et al. |
| 7,456,507 B2 | 11/2008 | Yang |
| 7,566,915 B2 | 7/2009 | Chang et al. |
| 7,646,078 B2 | 1/2010 | Jeng et al. |
| 7,763,887 B2 | 7/2010 | Han |
| 7,888,794 B2 | 2/2011 | Stecher |
| 8,125,052 B2 * | 2/2012 | Jeng et al. .................. 257/620 |
| 2001/0005604 A1 | 6/2001 | Lee et al. |
| 2001/0005617 A1 | 6/2001 | Feurle et al. |
| 2001/0008296 A1 | 7/2001 | Gelsomini et al. |
| 2001/0019848 A1 | 9/2001 | Misewich et al. |
| 2002/0024115 A1 | 2/2002 | Ibnabdeljalil et al. |
| 2002/0130394 A1 | 9/2002 | Toyoda |
| 2003/0003677 A1 | 1/2003 | Fukada |
| 2004/0084777 A1 | 5/2004 | Yamanoue et al. |
| 2004/0119164 A1 | 6/2004 | Kurashima et al. |
| 2004/0150070 A1 | 8/2004 | Okada et al. |
| 2004/0150073 A1 | 8/2004 | Matumoto et al. |
| 2005/0009300 A1 | 1/2005 | Murari et al. |
| 2005/0017363 A1 | 1/2005 | Lin et al. |
| 2005/0026397 A1 | 2/2005 | Daubenspeck et al. |
| 2005/0046015 A1 | 3/2005 | Shim |
| 2005/0098893 A1 * | 5/2005 | Tsutsue et al. ............... 257/758 |
| 2005/0148115 A1 | 7/2005 | Williams et al. |
| 2005/0151239 A1 * | 7/2005 | Lee ............................ 257/698 |
| 2005/0230005 A1 | 10/2005 | Liang et al. |
| 2005/0236672 A1 | 10/2005 | Kodama |
| 2005/0269702 A1 | 12/2005 | Otsuka |
| 2005/0280120 A1 | 12/2005 | Tomita |
| 2006/0001144 A1 | 1/2006 | Uehling et al. |
| 2006/0012012 A1 | 1/2006 | Wang et al. |
| 2006/0022195 A1 | 2/2006 | Wang |
| 2006/0055002 A1 | 3/2006 | Yao et al. |
| 2006/0055007 A1 | 3/2006 | Yao et al. |
| 2006/0088984 A1 | 4/2006 | Li |
| 2006/0103025 A1 | 5/2006 | Furusawa et al. |
| 2006/0125090 A1 | 6/2006 | Chen et al. |
| 2006/0172457 A1 | 8/2006 | Huang |
| 2006/0192265 A1 * | 8/2006 | Hsu ............................ 257/499 |
| 2007/0018279 A1 | 1/2007 | Lin |
| 2007/0018331 A1 | 1/2007 | Chen |
| 2007/0031996 A1 | 2/2007 | Chopin |
| 2007/0090447 A1 | 4/2007 | Morimoto et al. |
| 2007/0090547 A1 | 4/2007 | Su et al. |
| 2007/0158788 A1 * | 7/2007 | Yang ........................... 257/620 |
| 2007/0262435 A1 | 11/2007 | Lam |
| 2008/0054263 A1 | 3/2008 | Han |
| 2008/0067672 A1 | 3/2008 | Katoh |
| 2008/0157284 A1 | 7/2008 | Chang et al. |
| 2008/0213938 A1 | 9/2008 | Kao |
| 2008/0265378 A1 | 10/2008 | Lee et al. |
| 2008/0283969 A1 | 11/2008 | Jeng et al. |
| 2008/0299708 A1 | 12/2008 | Tsutsue |
| 2009/0115024 A1 | 5/2009 | Jeng et al. |
| 2009/0115025 A1 | 5/2009 | Jung |
| 2009/0302445 A1 | 12/2009 | Pagaila |
| 2009/0315184 A1 | 12/2009 | Tokitoh |
| 2009/0321890 A1 | 12/2009 | Jeng et al. |
| 2010/0123219 A1 | 5/2010 | Chen et al. |
| 2010/0207251 A1 | 8/2010 | Yu et al. |

FOREIGN PATENT DOCUMENTS

| | | |
|---|---|---|
| CN | 1770432 A | 5/2006 |
| CN | 1830079 A | 9/2006 |
| CN | 1956173 A | 5/2007 |

OTHER PUBLICATIONS

"Motorola MC7457RX1000NB Microprocessor", Sample Prep Delamination, Motorola Chipworks, Mar. 15, 2005, 1 page, Figure 3.1.3 Die Seal.

Pidin, S., et al., "MOSFET Current Drive Optimization Using Silicon Nitride Capping Layer for 65-nm Technology Node," 2004 Symposium on VLSI Technology Digest of Technical Papers, IEEE, Jul. 2004, pp. 54-55.

"Motorola MC7457RX1000NB Microprocessor," Sample Prep Delamination, Motorola Chipworks, Mar. 15, 2005, 1 page, Figure 3.1.3 Die Seal.

* cited by examiner

SEAL RING STRUCTURE WITH IMPROVED CRACKING PROTECTION AND REDUCED PROBLEMS

TECHNICAL FIELD

This invention relates to integrated circuits, and more particularly to structures and formation methods of seal rings.

BACKGROUND

Seal ring formation is an important part in the back-end of semiconductor processes. Seal rings are stress protection structures around integrated circuits, protecting the internal circuit inside semiconductor chips from damage caused by the sawing of the semiconductor chips from wafers.

Typical seal rings are usually formed of interconnected metal lines and connecting vias. FIG. 1 is a schematic view of a part of seal ring 10, which is formed on an inner side of scribe line 12, sometimes also referred to as dicing line 12. Typically, there is a circuit region (not shown) on the left-hand side of the drawing.

Seal ring 10 includes interconnected metal components, which are formed of metal lines 14 and conductive vias 18, both formed in dielectric layers 16. Metal lines 14 and vias 18 are physically connected. Moreover, passivation film 20 is formed over a top layer of seal ring 10.

Because of the provision of seal ring 10 and passivation film 20, the circuit region on the inner side of seal ring 10 is protected from influences of external environments, which may cause cracking in the semiconductor chips, thus it is possible to ensure stability of properties of the semiconductor device over a long period of time. Typically, seal rings may be electrically grounded. To have greater strength, vias 18 are preferably interconnected, forming a continuous via bar, as shown in FIG. 2.

A further function of seal ring 10 is to protect the integrated circuits on the inner side of seal ring 10 from moisture-induced degradation. Dielectric layers 16 are typically formed of porous low-k dielectric materials, moisture can easily penetrate through low-k dielectric layer 16 to reach the integrated circuits. Since seal ring 10 is formed of metal, it blocks the moisture penetration path and may substantially eliminate any moisture penetration.

Although the continuous via bars 18, combined with metal lines 14, can protect cracking from extending into circuit regions, the conventional seal rings suffer drawbacks. First, conventionally, only one seal ring with a continuous via bar is formed. If this seal ring is damaged, there will be no structure for preventing cracks from propagating into the respective semiconductor chip. Second, the continuous via bars often have widths substantially less than the thickness of the respective overlying metal lines, and hence do not have enough strength to stop crack propagation during die sawing. Third, the cracks may propagate through the interface 22 between passivation film 20 and the underlying layer into the circuit regions. New structures and formation methods are thus needed.

SUMMARY OF THE INVENTION

In accordance with one aspect of the present invention, an integrated circuit structure includes a lower dielectric layer; an upper dielectric layer over the lower dielectric layer; and a seal ring. The seal ring includes an upper metal line in the upper dielectric layer; a continuous via bar underlying and abutting the upper metal line, wherein the continuous via bar has a width substantially the same as a width of the upper metal line; a lower metal line in the lower dielectric layer; and a via bar underlying and abutting the lower metal line. The via bar has a width substantially less than a half of a width of the lower metal line.

In accordance with another aspect of the present invention, an integrated circuit structure includes a semiconductor chip including a plurality of dielectric layers, wherein the plurality of dielectric layers include a plurality of low-k dielectric layers; and a top dielectric layer over the plurality of low-k dielectric layers. The top dielectric layer has a k value greater than k values of the plurality of low-k dielectric layers. The integrated circuit structure further includes a seal ring adjacent edges of the semiconductor chip, wherein the seal ring includes a first top metal line in the top dielectric layer; a first continuous via bar underlying and abutting the first top metal line, wherein the first continuous via bar has a width substantially the same as a width of the first top metal line; a plurality of metal lines substantially aligned to each other, wherein each of the plurality of metal lines is in one of the plurality of low-k dielectric layers; and a plurality of vias underlying and abutting each of the plurality of metal lines. The plurality of vias include a first and a second via bar, each forming a ring; and a low-k dielectric material between the first and the second via bar.

In accordance with yet another aspect of the present invention, an integrated circuit structure includes a lower dielectric layer; an upper dielectric layer over the lower dielectric layer, wherein the upper dielectric layer has a greater k value than the lower dielectric layer; and a seal ring. The seal ring includes an upper metal line in the upper dielectric layer; a continuous via bar underlying and abutting the upper metal line, wherein the continuous via bar has a width substantially the same as a width of the upper metal line; a lower metal line in the lower dielectric layer; and a plurality of vias underlying and abutting the lower metal line. The plurality of vias includes a via bar having a width substantially less than a half of a width of the lower metal line; and a plurality of discrete vias spaced apart from each other, wherein the plurality of discrete vias forms a line parallel to the via bar.

Advantageously, by using the embodiments of the present invention, the crack-propagation occurring due to die sawing is reduced, and the etching problem due to forming large via openings in low-k dielectric materials is solved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Seal ring structures with improved crack preventing ability and methods of forming the same are provided. The variations of the preferred embodiments are discussed. Throughout the various views and illustrative embodiments of the present invention, like reference numbers are used to designate like elements.

Figure 1:
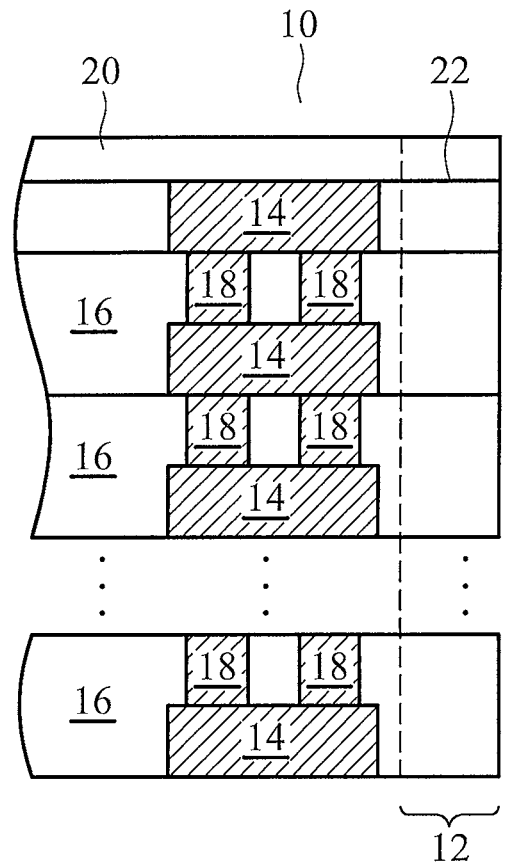
FIGS. 1 and 2 illustrate conventional seal rings.
Figure 2:
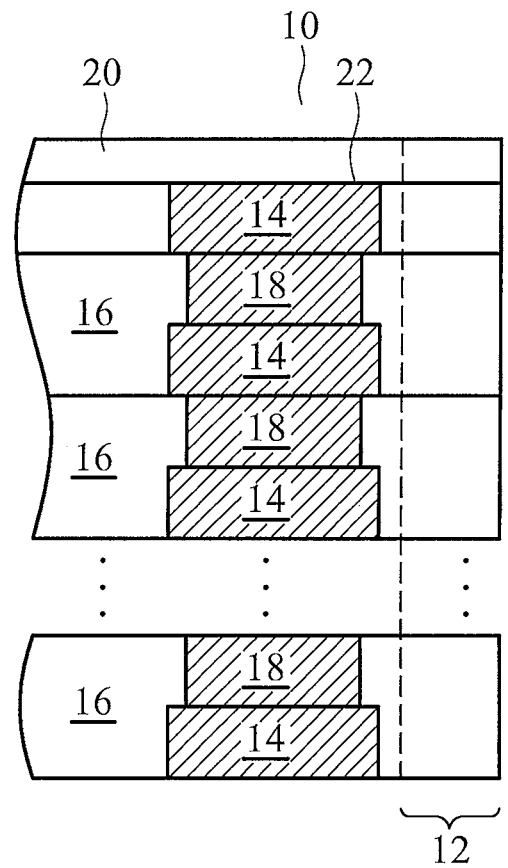
Figure 3A:
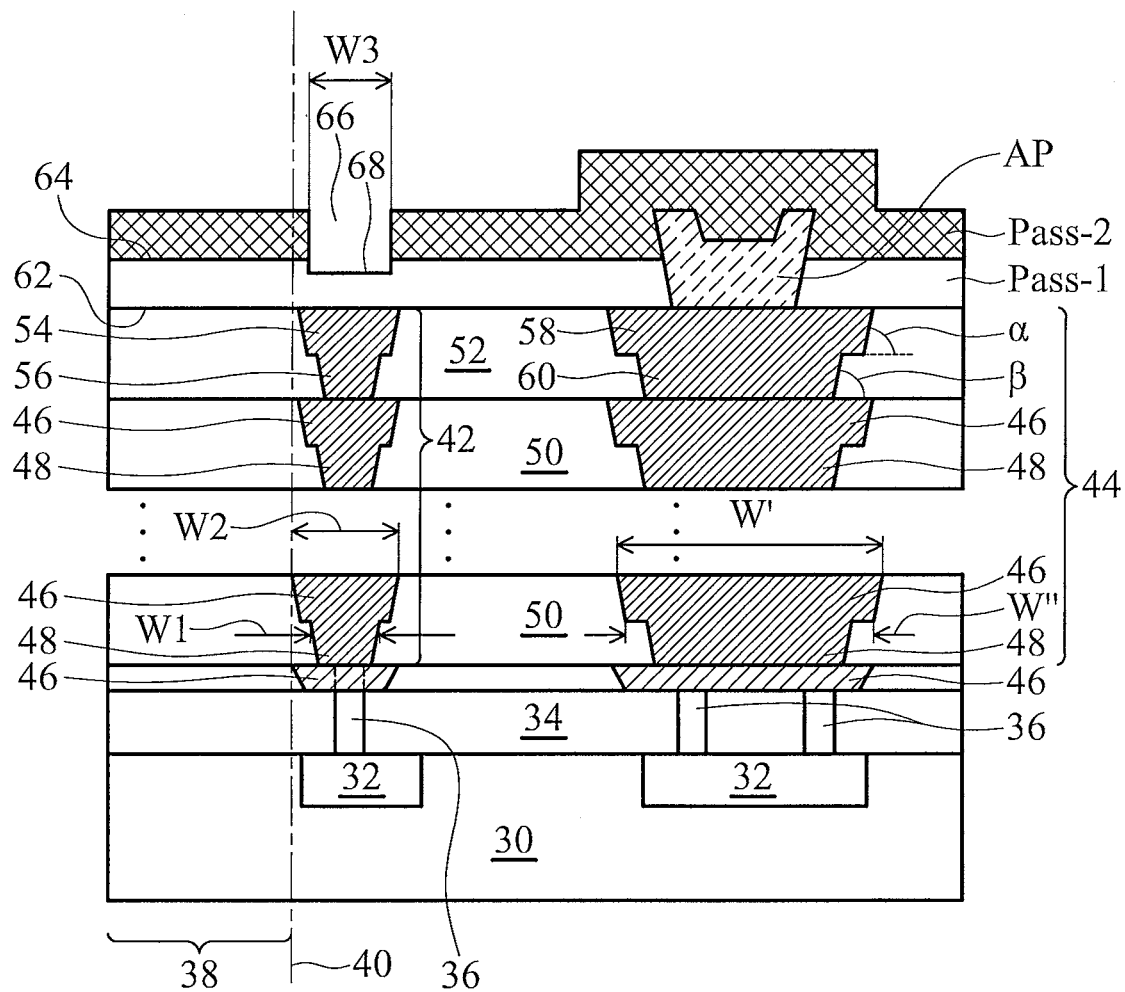
FIGS. 3A through 4B and FIG. 6 are cross-sectional views of dual-passivation embodiments of the present invention, wherein a trench is formed close to two seal rings.

FIG. 3A illustrates a first embodiment of the present invention. A portion of a semiconductor wafer includes semiconductor substrate 30, which is preferably formed of silicon or other group III, group IV, and/or group V elements. Preferably, semiconductor substrate 30 is lightly doped with a p-type impurity. Heavily doped p-type (p+) regions 32 are formed at the top surface of semiconductor substrate 30. Inter-layer dielectric (ILD) 34 is formed over substrate 30. ILD 34 may be formed of phosphoboronsilicate glass (PBSG) or other commonly used materials.

In an embodiment, contacts 36 are formed in ILD 34, and are electrically connected to p+ regions 32. Contacts 36 are connected to an electrical ground (not shown). A scribe line boundary 40 is illustrated, wherein scribe line 38 is to the left of scribe line boundary 40, and a semiconductor chip is to the right of scribe line boundary 40.

Two seal rings 42 and 44 are formed. In the preferred embodiment, the first seal ring 42 (alternatively referred to as a sacrificial seal ring), which is closer to scribe line 38, is preferably narrower than the second seal ring 44 (a main seal ring). Each of the seal rings 42 and 44 includes a plurality of metal lines 46 and vias 48 formed in low-k dielectric layers 50. The dielectric constants (k values) of low-k dielectric layers 50 are preferably lower than 3.0, and more preferably lower than about 2.5, hence are also referred to as extreme low-k (ELK) dielectric layers 50 throughout the description. As is known in the art, the bottom metal lines 46 may be formed using a single damascene process, while upper metal lines 46 may be formed using dual damascene processes along with the underlying vias 48.

Over dielectric layers 50, top dielectric layer 52 is formed, in which metal lines 54 and 58 and vias 56 and 60 are formed. The top dielectric layer 52 may be formed of un-doped silicate glass (USG) in order to improve the mechanical property and prevent moisture penetration, and hence is referred to as USG 52 throughout the description, although it may be formed of other materials. Preferably, metal lines 46, 54, and 58 and vias 48, 56, and 60 comprise copper or copper alloys. A first passivation layer, which is referred to as Pass-1 throughout the description, is formed over the top dielectric layer 52. Passivation layer Pass-1 preferably comprises dielectric materials such as oxides or nitrides.

Seal ring 44 further includes an aluminum ring (alternatively referred to as aluminum pad, or AP throughout the description) over, and physically connected to, metal line 58. Aluminum ring AP includes a portion over passivation layer Pass-1, and a portion penetrating passivation layer Pass-1. A second passivation layer Pass-2 is formed over passivation layer Pass-1 and aluminum ring AP. Passivation layers Pass-1 and Pass-2 may be formed of oxides, nitrides, and combinations thereof, and may be formed of the same or different materials.

In the preferred embodiment, vias 48, 56, and 60 are via bars, and their widths are preferably greater than about 70% of the widths of overlying metal lines 46, 54, and 58, respectively. Throughout the description, such type of via bars are referred to as continuous via bars since they are similar to a collection of thinner via bars abutted to each other in a continuous way. More preferably, widths W1 and W2 are substantially equal to each other. In other embodiments, each of the vias 48, 56, and 60 is a via bar group including two or more parallel thin via bars. (refer to via bar group 56 in FIG. 9B as an example). Please note that seal rings 42 and 44 are rings formed close to the edges of the respective semiconductor chip. Accordingly, metal lines 46, 54, and 58, vias 48, 56, and 60, and aluminum ring AP each form a ring, and each of the rings has four edges, each proximates the respective edges of the semiconductor chip, and their distances to the scribe lines of the respective sides are preferably about 10 μm or less.

In the preferred embodiment, metal lines 46, 54, and 58, vias 48, 56, and 60, and aluminum ring AP preferably have tapered profiles with tilted edges, and thus metal lines 46, 54, and 58 having tilt angle α and vias 48, 56, and 60 having tilt angle β. Accordingly, a tapered metal line (46, 54, or 58), a tapered via (48, 56, or 56) and/or aluminum ring AP will have a top width greater than a bottom width, as is illustrated by top width W' and bottom width W". Tilt angles α and β are preferably between about 84 degrees and about 87 degrees. More preferably, tilt angles α and β are about 86 degrees. Advantageously, with tilt angles α and β less than 90 degrees, metal lines 46, 54, and 58, vias 48, 56, and 60, and aluminum ring AP are more effective in imparting stresses downward. Accordingly, the stress generated by die sawing is more likely to be absorbed by the seal rings, which are robust. The formation of the tilted edges of metal lines 46, 54, and 58, vias 48, 56, and 60, and aluminum ring AP may be achieved by adjusting process conditions, such as increasing the percentages of etching gases like $C_4F_8$, CHF, reducing the percentages of oxygen and nitrogen containing gases, and/or reducing bias power, etc.

Figure 3B:
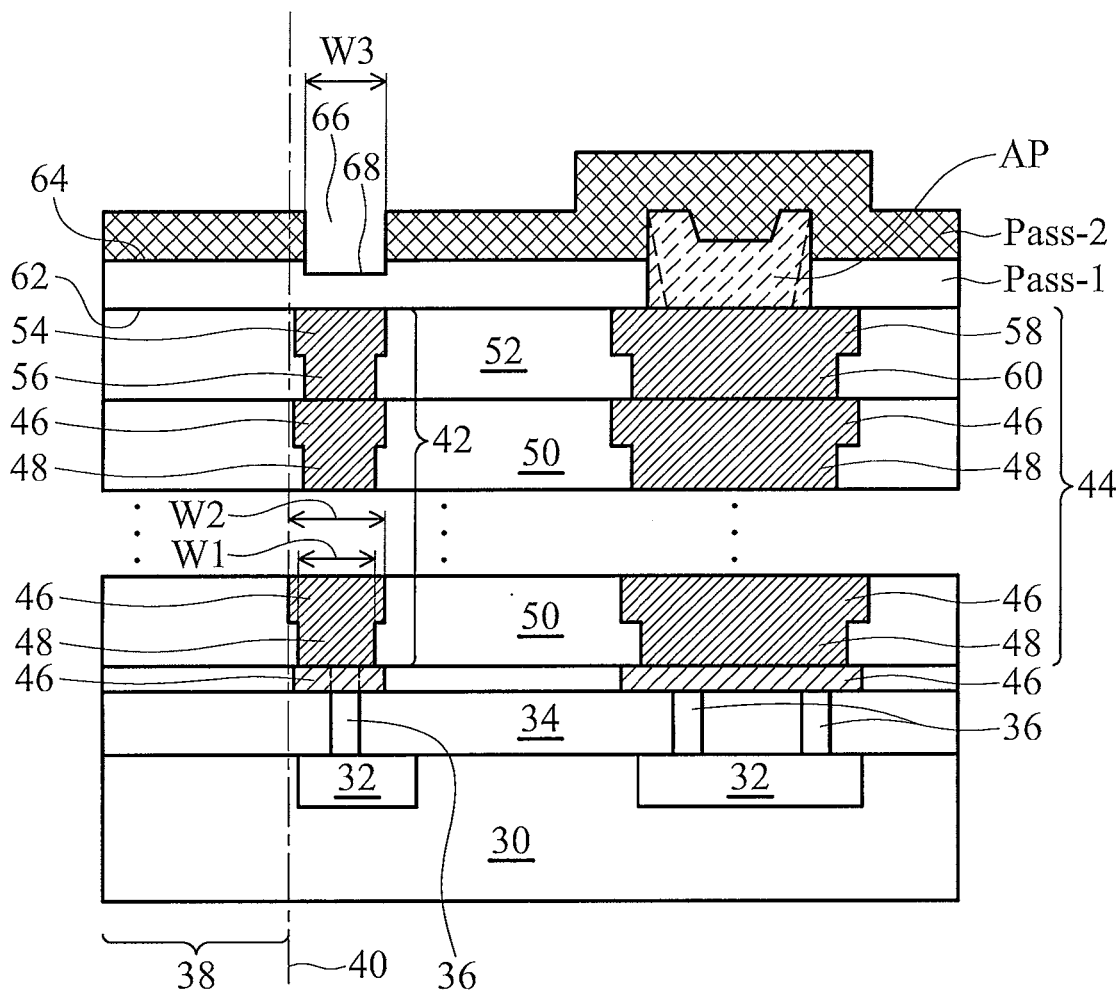

FIG. 3B illustrates another embodiment of the present invention, wherein metal lines 46, 54, and 58, vias 48, 56, and 60, and aluminum ring AP have substantially vertical edges. In each of the embodiments discussed in the subsequent paragraphs, metal lines 46, 54, and 58, vias 48, 56, and 60, and aluminum ring AP may each have substantially vertical edges, which are shown in solid lines, or tilted edges, which are shown in dashed lines.

It is appreciated that the structures and materials discussed in preceding paragraphs can also be used in other embodiments of the present invention, unless specified otherwise. For simplicity, the details of these structures and materials are not repeated in subsequently discussed embodiments.

As a result of sawing the wafer, cracks may occur at kerf lines and propagate into semiconductor chips. Experiments performed by inventors revealed that a significant percentage, sometimes greater than 50 percent, of the cracks occur at top portions of the semiconductor chip, for example, in USG 52 or passivation layers Pass-1 and Pass-2. Particularly, the interface 62 between USG 52 and Pass-1, and the interface 64 between Pass-1 and Pass-2 are vulnerable to the cracking, and cracks tend to propagate along interfaces 62 and 64 into the semiconductor chip. Based on this finding, embodiments of the present invention are provided.

In the embodiment shown in FIGS. 3A and 3B, seal ring 42 is formed adjacent to, and preferably substantially adjoining, scribe line 38. Before the die sawing of the wafer, trench 66 is formed over sacrificial seal ring 42. If viewed from top, trench 66 also forms a trench ring having four edges, each proximate a respective edge of the semiconductor chip. The bottom 68 of trench 66 is preferably at least level with the interface 64. More preferably, bottom 68 extends below interface 64, for example, for greater than about 200 Å. However, a layer of Pass-1 material needs to remain on metal line 54 to prevent metal line 54 from being exposed. An advantageous feature of trench 66 is that if a crack occurs during die sawing and propagates along interface 64, the crack will be stopped by trench 66. Even if the crack propagates across trench 66, if at all, the stress of the crack is substantially released by trench 66, and seal ring 44 will effectively prevent any further propagation of the crack. This provides double insurance for the crack prevention. It is appreciated that any crack occurring at a level higher than bottom 68 of trench 66 will be stopped, including those occurring in passivation layer Pass-2. Trench 66 preferably has width W3 of greater about 2 μm.

Figure 4A:
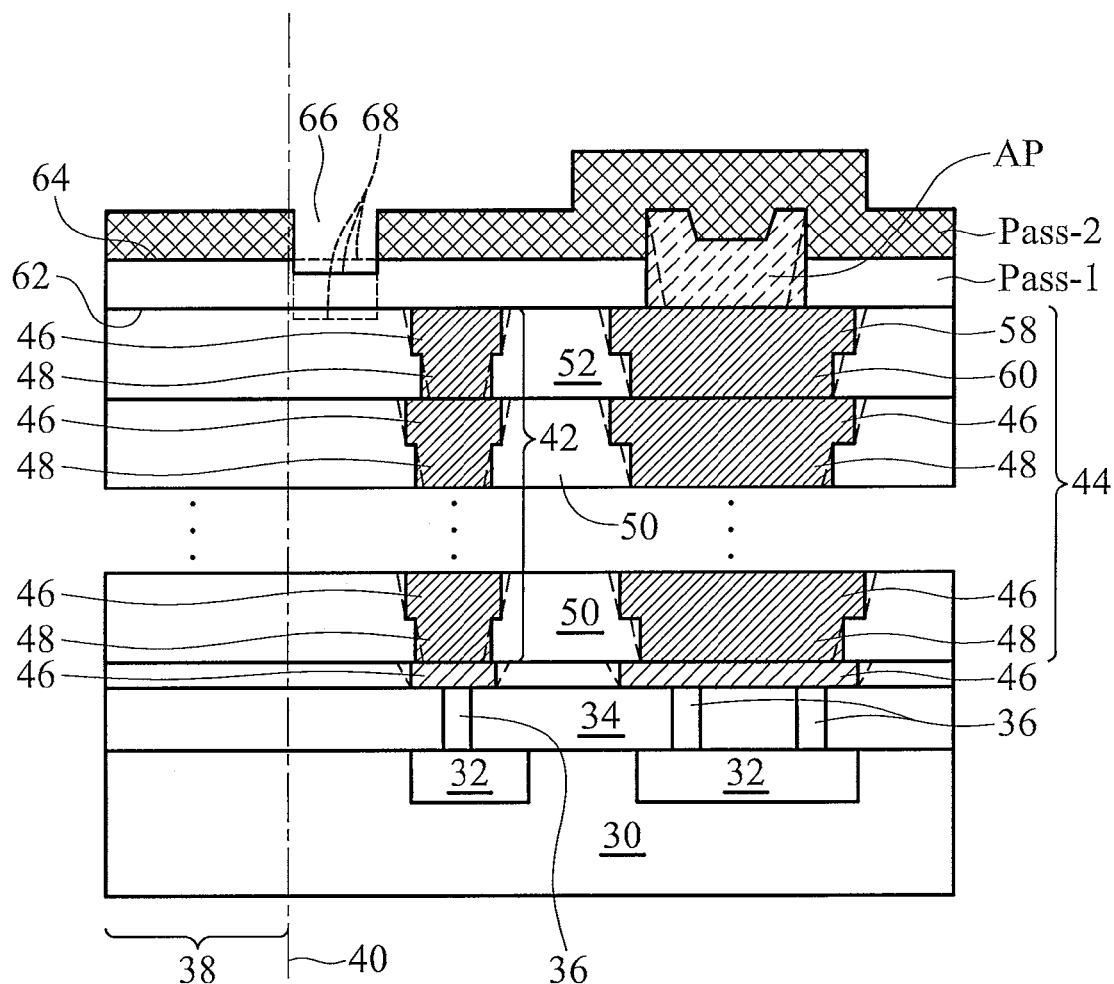

FIG. 4A illustrates a second embodiment of the present invention, wherein seal ring 42 is formed away from scribe line 38. Trench 66 includes at least a portion horizontally between seal ring 42 and scribe line 38. Further, the entire trench 66 may be between seal ring 42 and scribe line 38. In this case, the bottom 68 of trench 66 may extend below the interface 62, wherein the corresponding position of bottom 68 is illustrated using a dashed line. Alternatively, bottom 68 may be substantially leveled to interface 64 or between interfaces 62 and 64. If, however, trench 66 includes a portion directly over seal ring 42, the bottom 68 is preferably higher than interface 62, so that at least one thin passivation layer Pass-1 remains over metal line 54.

Figure 4B:
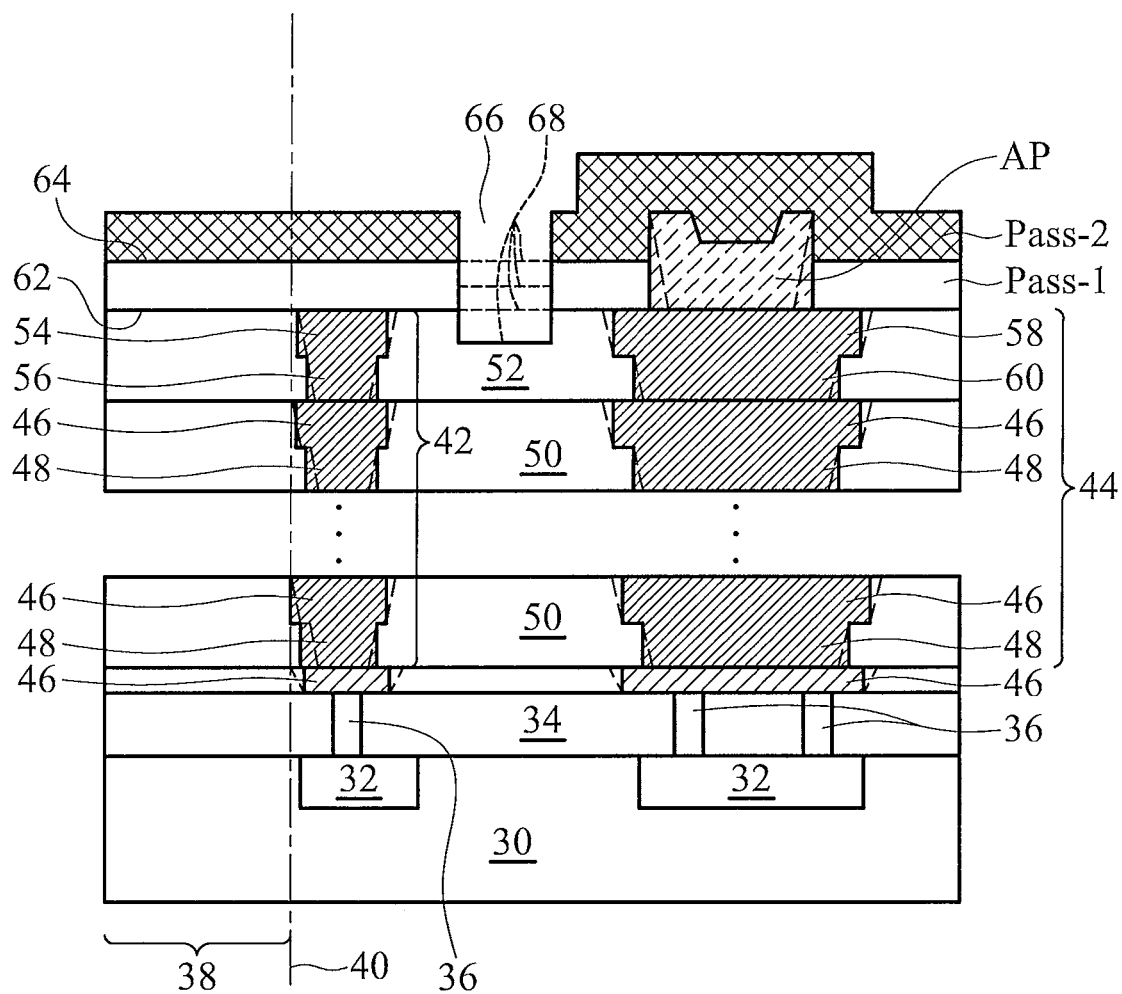

Trench 66 may be located anywhere between scribe line 38 and main seal ring 44. FIG. 4B illustrates an alternative embodiment, wherein trench 66 is between seal rings 42 and 44. In this embodiment, bottom 68 of trench 66 may also be below interface 62, or at other positions as shown in dashed lines. Advantageously, with bottom 68 below interface 62, the cracks propagated along interface 62 may be stopped.

Figure 5:
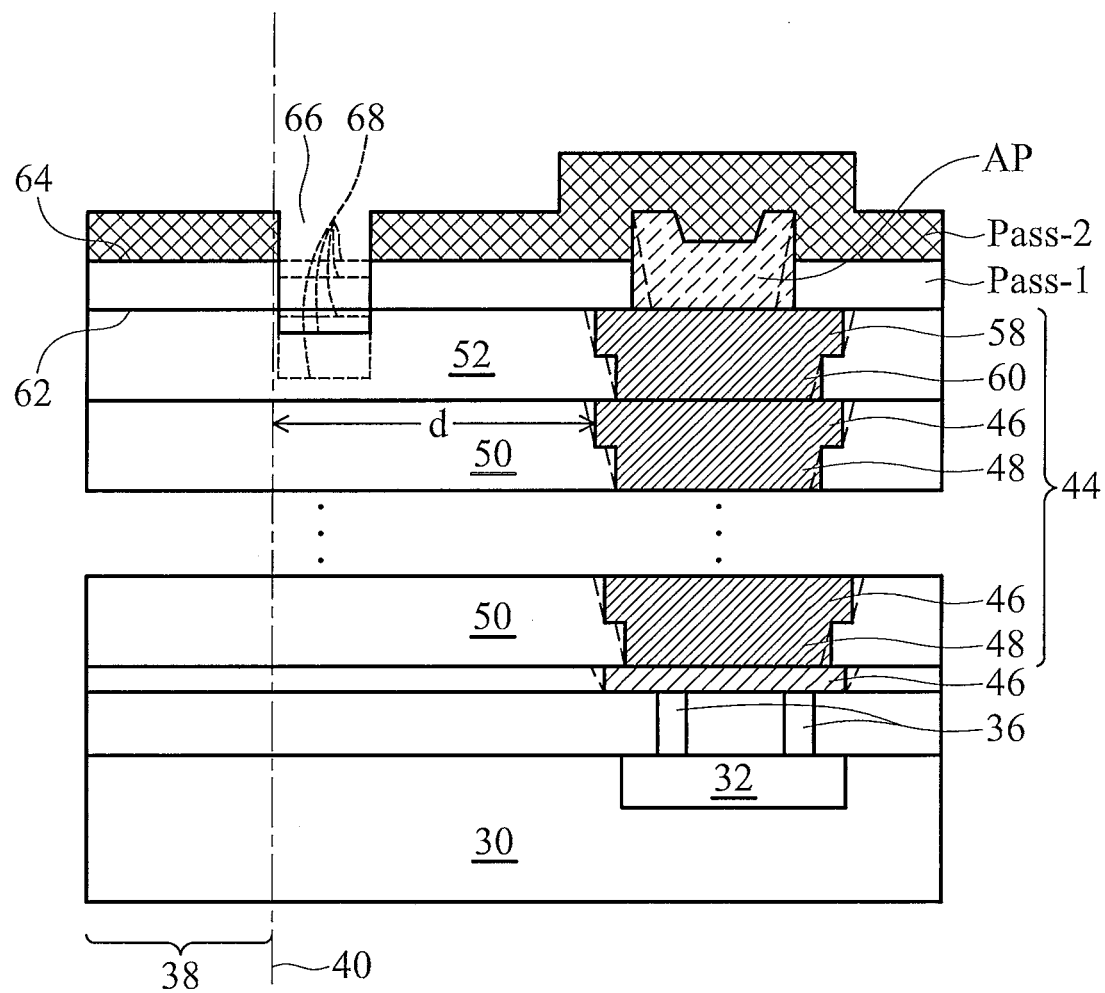
FIG. 5 is a cross-sectional view of an embodiment of the present invention, wherein only one seal ring is formed with a trench formed nearby.

FIG. 5 illustrates a third embodiment of the present invention, wherein no sacrificial seal ring is formed. Seal ring 44 is spaced apart from scribe line 38. The distance D is at least great enough to accommodate trench 66. In an exemplary embodiment, distance D is greater than about 2 μm. Trench 66 is formed substantially adjoining, but outside of scribe line 38, and it is preferable that in the die sawing, the kerf will not cut through trench 66. Again, the bottom 68 of trench 66 is preferably at least level to interface 64, and more preferably between interfaces 62 and 64, and even more preferably lower than interface 62. Bottom 68 may even extend lower than metal line 58, but higher than the top low-k dielectric layer 50. The dashed lines illustrate several possible positions of bottoms 68. Advantageously, cracks propagated in USG 52 or above will be stopped by trench 66, and seal ring 44 provides an additional protection.

Figure 6:
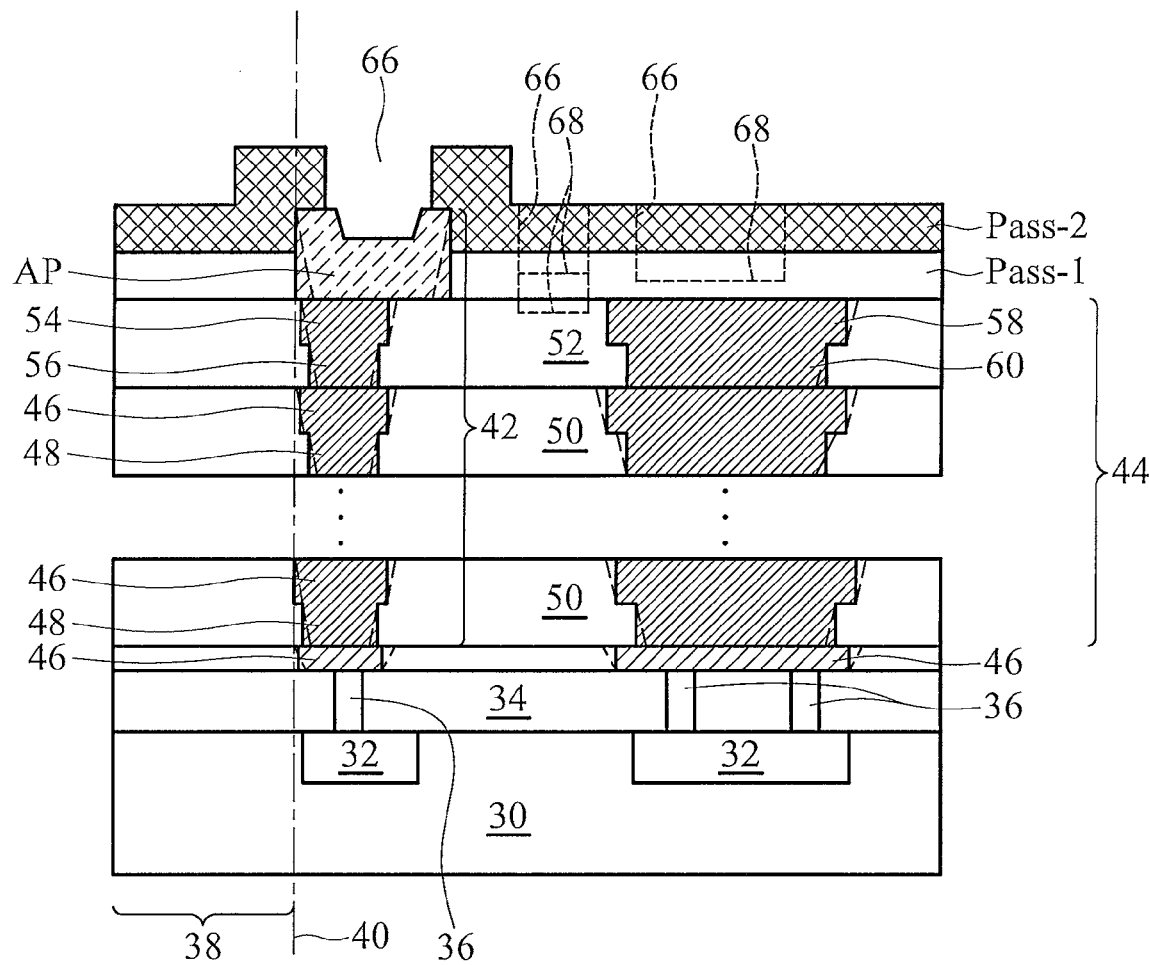

FIG. 6 illustrates a fourth embodiment of the present invention, wherein aluminum ring AP is formed over seal ring 42 instead of seal ring 44. Accordingly, trench 66 may be formed anywhere between scribe line 38 and the right boundary of seal ring 44. Several exemplary positions of trench 66 and bottom 68 are illustrated with dashed lines. Again, depending on the position of trench 66, the bottom 68 may be within passivation layers Pass-2, Pass-1, USG 52 or at their interfaces.

Figure 7:
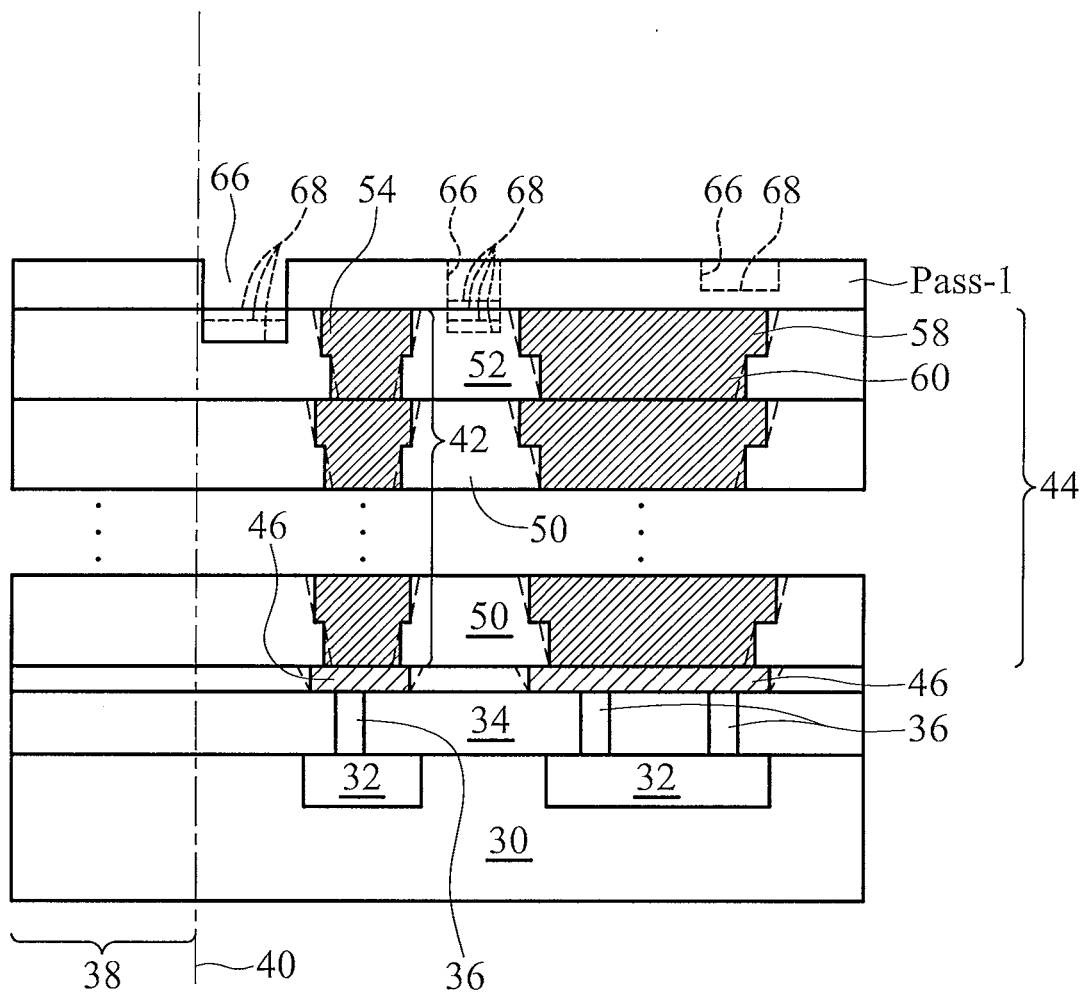
FIGS. 7 through 8B are cross-sectional views of single-passivation embodiments of the present invention, wherein two seal rings are formed with a trench formed nearby.

The embodiments discussed in the preceding paragraphs illustrate dual-passivation schemes including passivation layers Pass-1 and Pass-2. FIGS. 7 through 9B illustrate single-passivation schemes, in which only one passivation layer is formed. Accordingly, no aluminum pad APs are formed. This type of seal ring may be used in direct-bump-on copper applications. In FIG. 7, passivation layer Pass-1 is formed over USG 52 and metal lines 54 and 58. Trench 66 is preferably formed between seal ring 42 and scribe line 38. Accordingly, cracks are blocked before they reach seal ring 42. Alternatively, trench 66 may be formed anywhere between scribe line 38 and the right edge (inner edge) of seal ring 44. Depending on the position of trench 66, the bottom 68 of trench 66 may be at different positions, as illustrated by dashed lines.

Figure 8A:
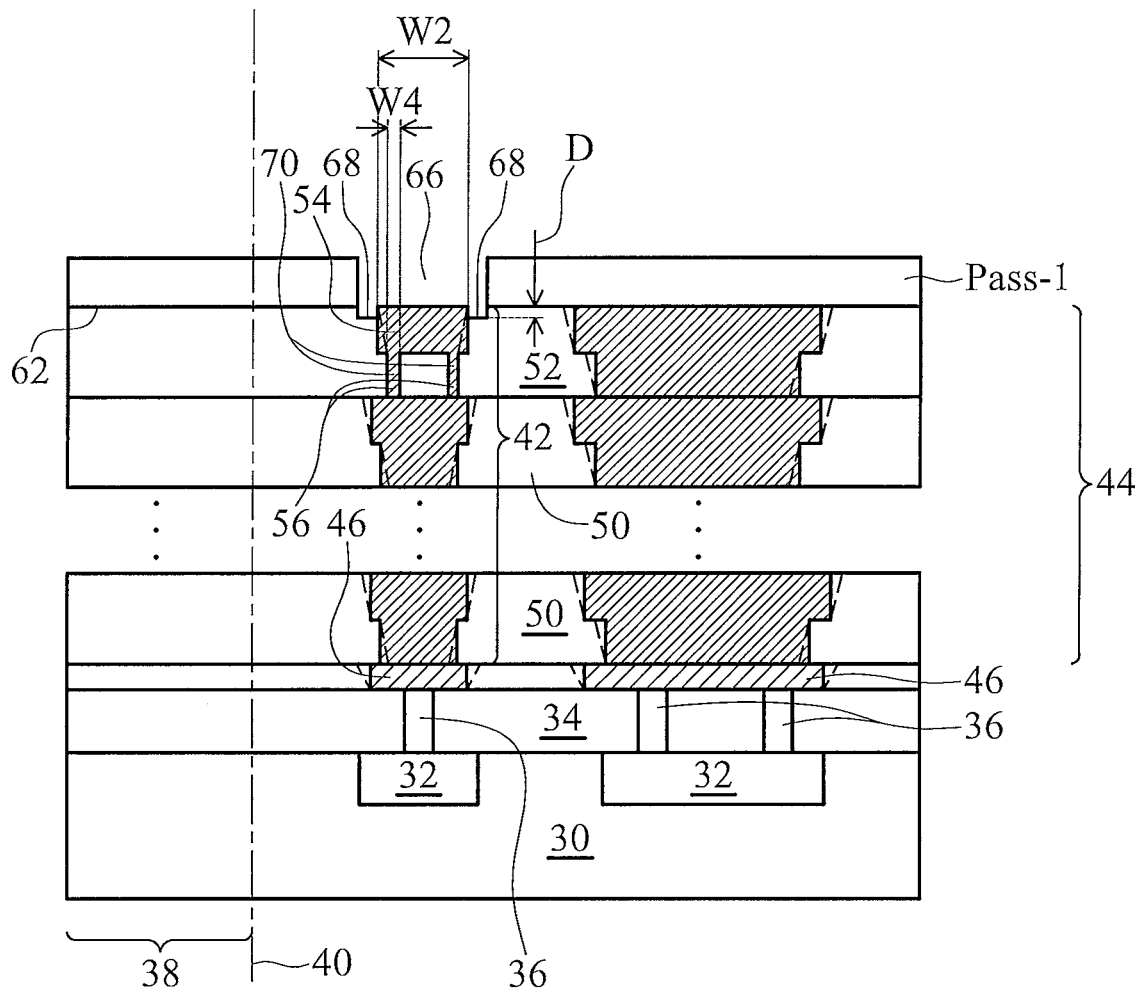
Figure 8B:
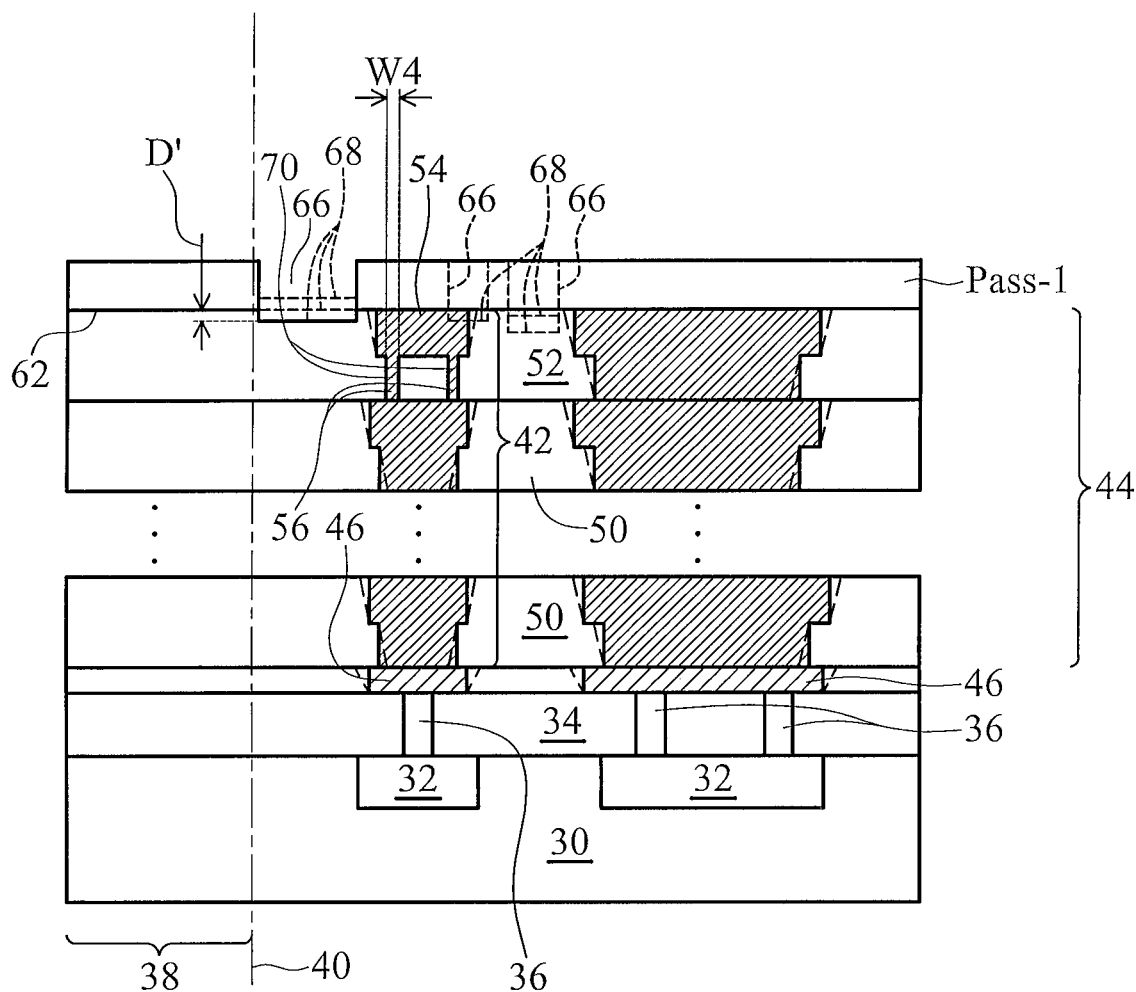

In FIGS. 8A and 8B, via 56 comprises at least two, and may be more, thin via bars 70 instead of a single wide via bar. Thin via bars 70 may be separated by the same dielectric material for forming dielectric layer 52, preferably USG. Each of the via bars 70 also forms a ring. The width W4 of via bars 70 is preferably less than about 0.4 μm. Also, width W4 is preferably less than about 20 percent of the width W2 of metal line 54. It is realized that after the die saw, and in subsequent under-bump metallurgy (UBM) etching process, if the acid is in contact with metal line 54, metal line 54 may be etched. However, since via bars 70 are very thin, the etching of via bars 70 is significantly slower, and hence the portion of seal ring 42 underlying via bars 70 are protected from the etching. With the advantageous feature of via bars 70, trench 66 may be formed directly over seal ring 42 with a part or an entirety of metal line 54 exposed through trench 66. Preferably, the bottom 68 of trench 66 is lower than the top surface of metal line 54, with a difference D of greater than about 200 Å. Advantageously, the overlap of trench 66 and metal line 54 blocks the crack path along interface 62, and any other paths above interface 62.

In FIG. 8B, trench 66 is located with at least one portion between seal ring 42 and scribe line 38. Alternatively, the entire trench 66 may be between scribe line 38 and seal ring 42. Again, the bottom 68 of trench 66 is preferably leveled to interface 62, and more preferably below interface 62, with difference D' of greater than about 200 Å. FIG. 8B also illustrates other possible locations of trenches 66 and bottoms 68.

Figure 9A:
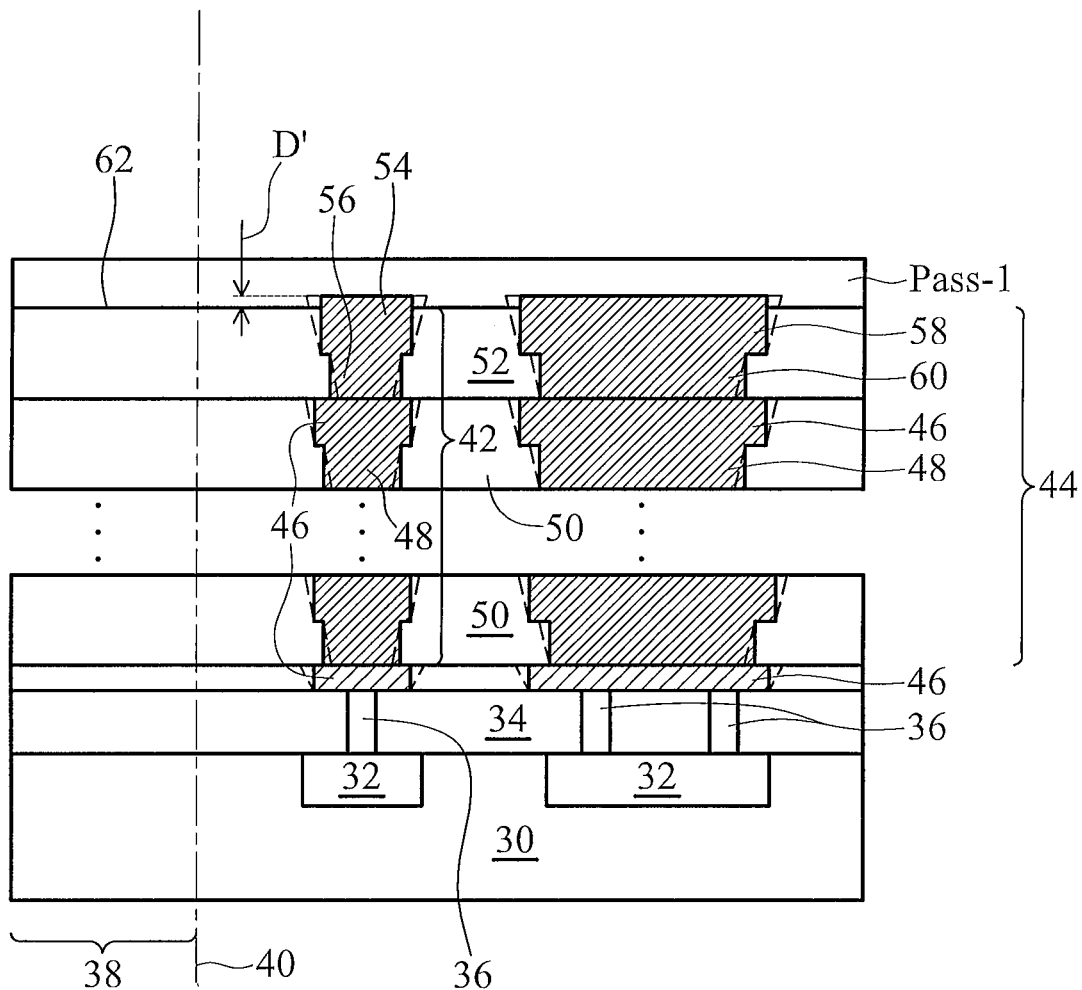
FIGS. 9A and 9B are cross-sectional views of single-passivation embodiments of the present invention, wherein a top surface of a top dielectric layer is recessed to be lower than the top surfaces of top metal lines.

FIG. 9A illustrates yet another embodiment having the single-passivation scheme. In this embodiment, after the formation of metal lines 46 and vias 48 in dielectric layers 50, USG 52 is formed. Metal lines 54 and 58 and vias 56 and 60 are then formed by forming openings in USG 52, filling the openings, and performing a chemical mechanical polish to remove excess filling materials, leaving metal lines 54 and 58 and vias 56 and 60. A dry etching or wet etching is then performed to recess the top surface 62 of USG 52. The recessing distance D' is preferably greater than about 200 Å. Advantageously, if a crack is propagated along interface 62, it will encounter the protruding portion of metal line 54, and will be stopped.

Figure 9B:
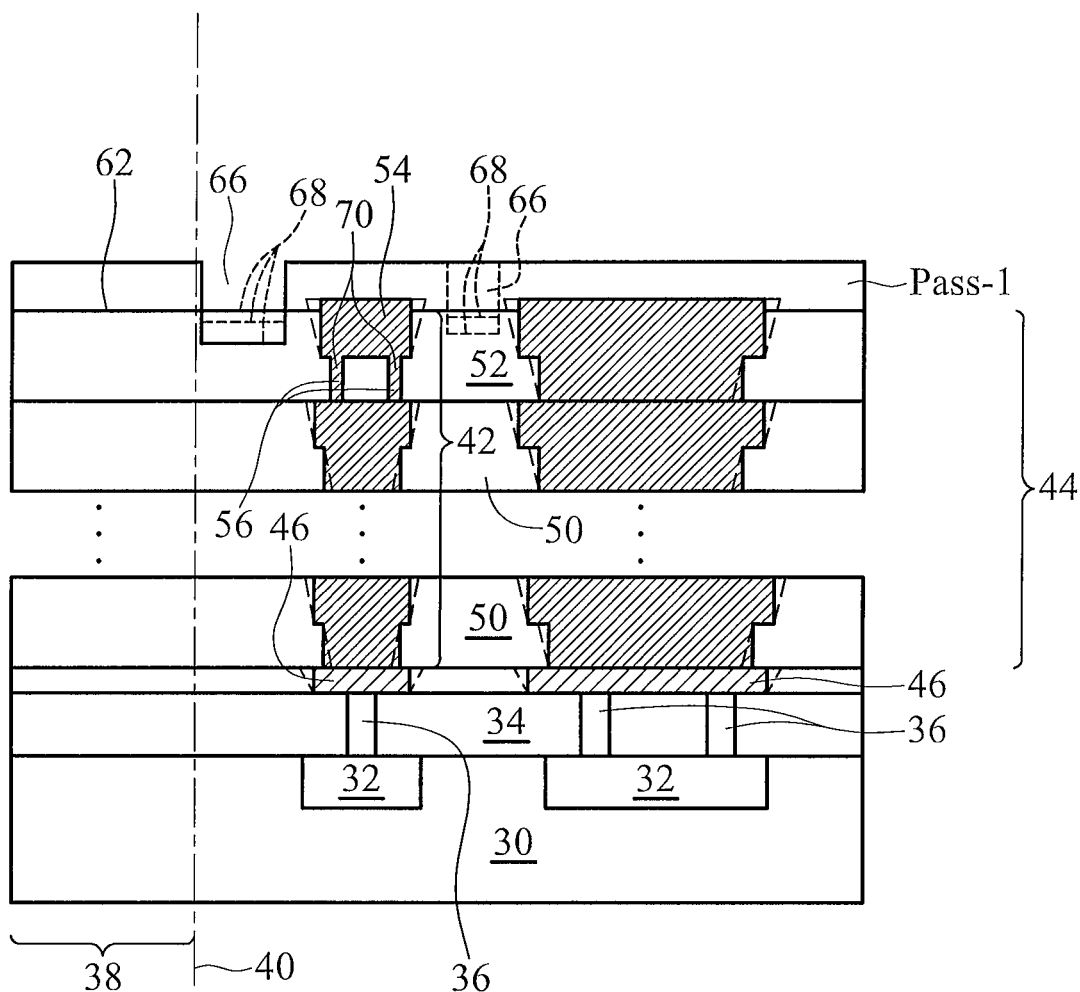

In FIG. 9B, trench 66 is further formed between scribe line 38 and seal ring 42. The bottom 68 of trench 66 is preferably at least lower then the top surface of metal line 54, and more preferably level with interface 62. The bottom 68 may also be anywhere lower than interface 62 but higher than the bottom surface of USG 52. Preferably, via 56 includes at least two thin via bars 70, which are essentially the same as in FIGS. 8A and 8B. Therefore, even if the crack caused by the die saw results in the exposure of metal line 54 through trench 66, thin via bars 70 will protect seal ring 42 from being etched in the subsequent UBM etching.

It is noted that in each of the embodiments shown in FIGS. 3 through 8B, the interfaces 62 may be recessed using essentially the same method as shown in FIGS. 9A and 9B. Accordingly, trenches 66 and the recessing of the interfaces 62 are combined so that cracks are even less likely to penetrate into integrated circuits.

In the packaging of the semiconductor chip after the die saw, trench 66 may be filled with either a underfill or a molding compound, depending on the packing process.

In the embodiments discussed in the preceding paragraphs (for example, the embodiments shown in FIGS. 3A and 3B), seal rings 42 and 44 each includes metal lines 46 and 54/58, and continuous via bars 48 and 56/60. As discussed in the preceding paragraphs, the continuous via bars 48 and 56/60 preferably have widths greater than about 70% of the widths of the overlying metal lines 46 and 54/58, and may even be close to, or substantially equal to, the widths of respective metal lines 46 and 54/58. Experiments have revealed that when etching dielectric layers to form via openings for continuous via bars 48, the smaller width of the via openings cause etching difficulty, particularly for 90 nm technology and below. Variations of the preferred embodiments are thus provided to solve this problem. Please note that the embodiments shown in FIGS. 10A through 12 may be combined with the embodiments discussed in preceding paragraphs in order to achieve stronger seal ring structures and a better crack-prevention ability without causing significant process difficulty. Also, metal lines 46, 54, and 58 in FIGS. 10A through 12 may have tilted edges, similar to the embodiment shown in FIG. 3A.

Figure 10A:
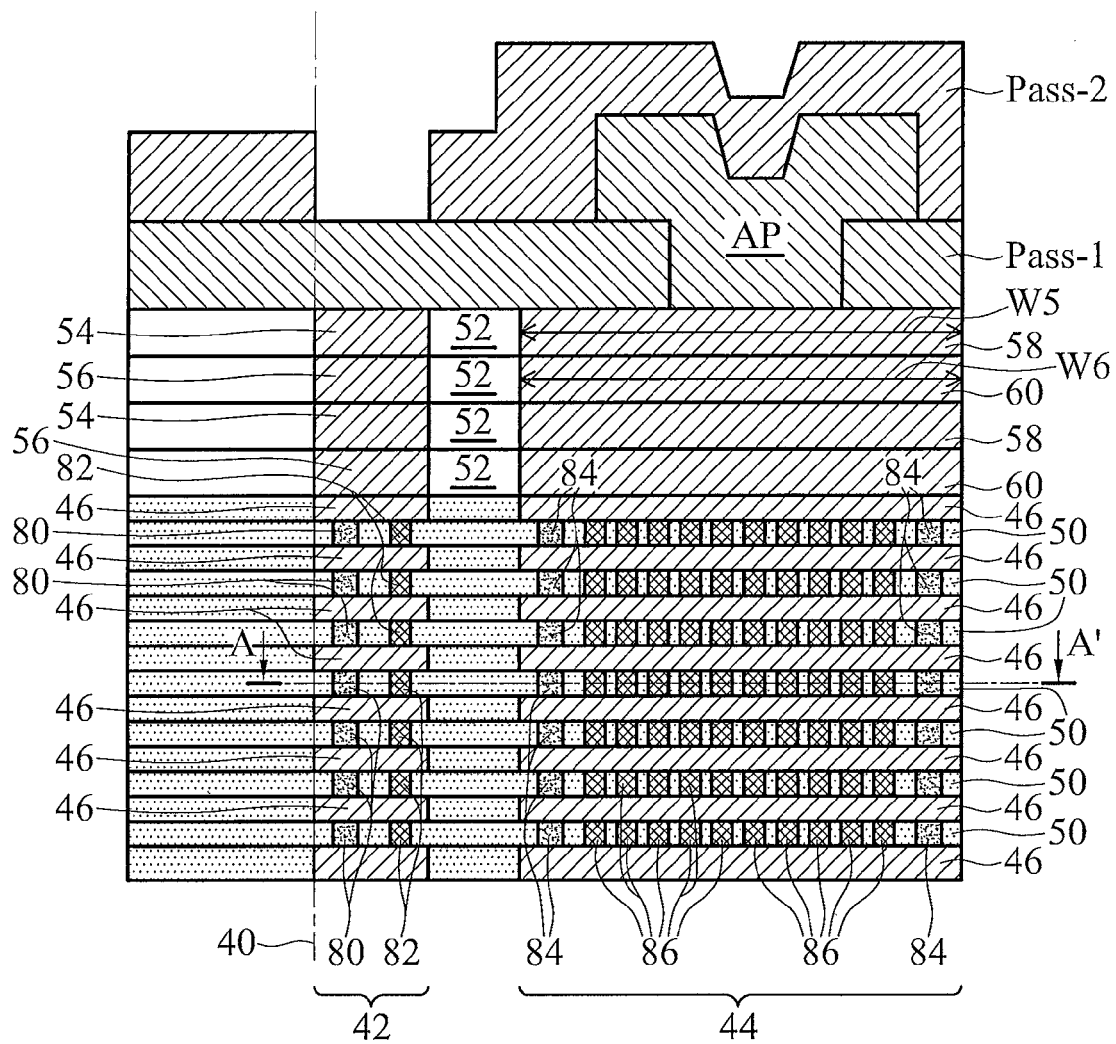
FIGS. 10A and 10B illustrate seal rings having hybrid layouts in higher layers and lower layers, wherein the higher layers include continuous via bars, and the lower layers include thinner via bars and discrete vias.

Referring to FIG. 10A, seal rings 42 and 44 each includes portions in top dielectric layers 52 and portions in low-k dielectric layers 50. As discussed in the preceding paragraphs, top dielectric layers 52 are preferably formed of USG, although they can be formed of other materials that are denser, and mechanically stronger, than the low-k dielectric materials in low-k dielectric layers 50. In the top dielectric layers 52, vias 60 are preferably continuous via bars having width W6 greater than about 70 percent of the width W5 of the respective overlying metal lines 58. Width W6 may even be substantially equal to the width W5 of the respective overlying metal lines 58.

Figure 10B:
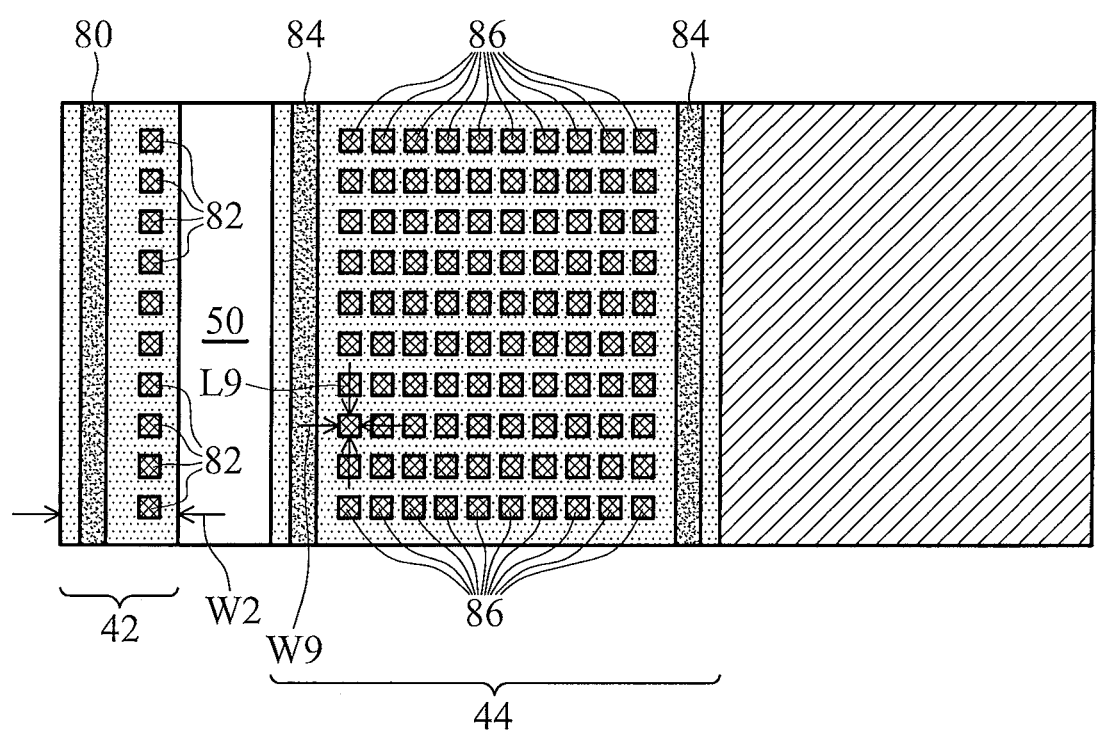

FIG. 10B illustrates a top view of the embodiment shown in FIG. 10A, wherein the cross-sectional view is taken along line A-A' in FIG. 10A. The vias connecting two layers of seal ring 42 includes via bar 80 and vias 82 (referred to as discrete vias hereinafter). Via bar 80 forms a ring extending along the perimeter of the respective semiconductor chip. Discrete vias 82 form a line parallel to via bar 80. Similarly, the line formed of discrete vias 82 extends along the four edges of the respective semiconductor chip, and also has a ring-like shape.

Seal ring 44 includes via bars 84 and discrete vias 86. Preferably, discrete vias 86 form an array, and the array extends along the edges of the respective semiconductor chip to form a ring-like structure. In the preferred embodiment, one of the via bars 84 is on an inner side of vias 86, and the other is on an outer side (the side close to the edge of the respective semiconductor chip) of discrete vias 86. In other embodiments, via bars 84 may be formed between discrete vias 86. In yet other embodiments, additional via bars, which are similar to via bars 84, may be inserted between discrete vias 86. Discrete vias 82 and 86 each may have a width W9 equal to a length L9. Alternatively, the length L9 and width W9 are different, but are comparable, with a ratio of length to width being less than about 2. It is realized that if the width of seal ring 42 is great enough, more discrete vias 82 may be added to form a via array similar to discrete vias 86. Advantageously, by forming discrete vias and thinner via bars, the etching difficulty resulting from etching large dielectric areas for via openings is reduced.

Figure 11A:
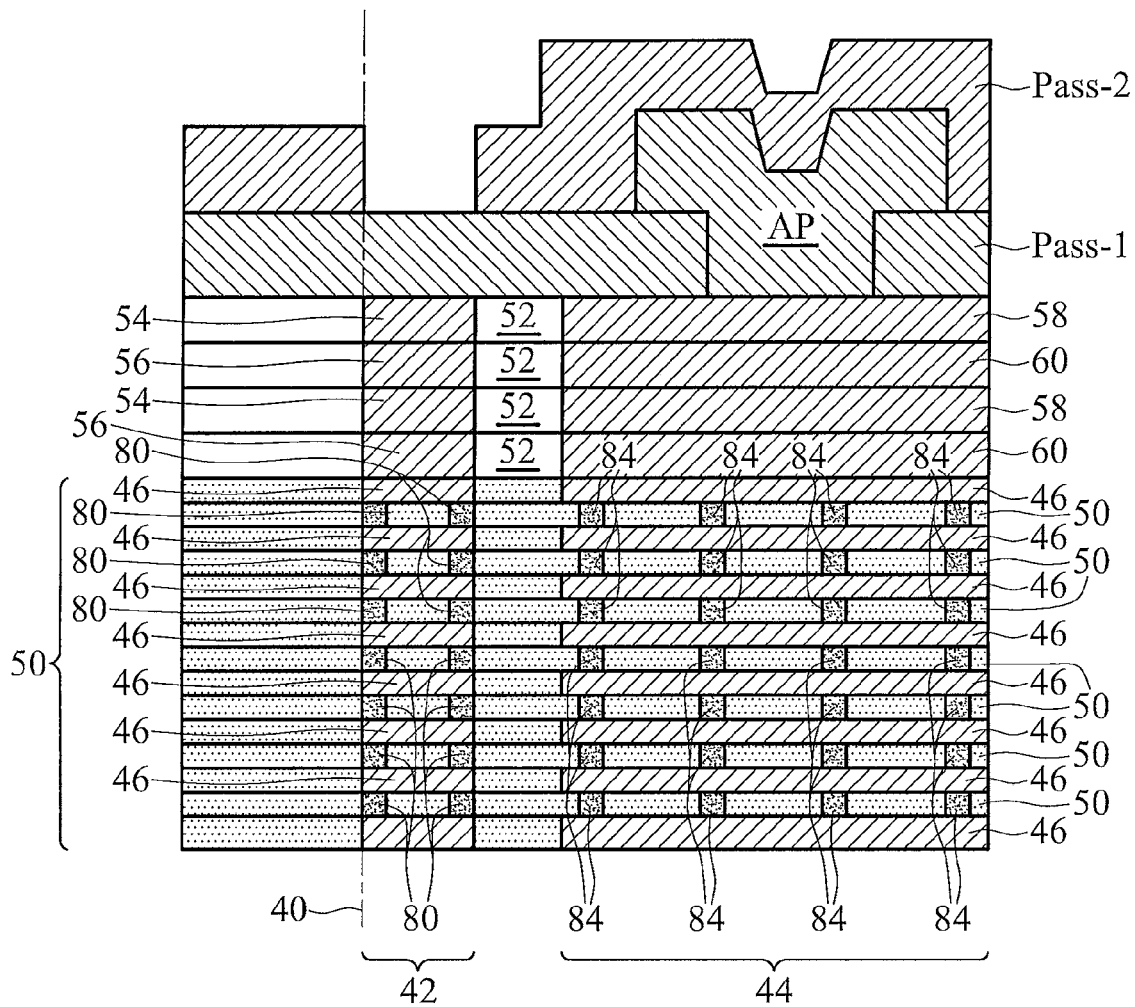
FIGS. 11A and 11B illustrate seal rings having hybrid layouts in the higher layers and the lower layers, wherein the higher layers include continuous via bars, and the lower layers include thinner via bars.
Figure 11B:
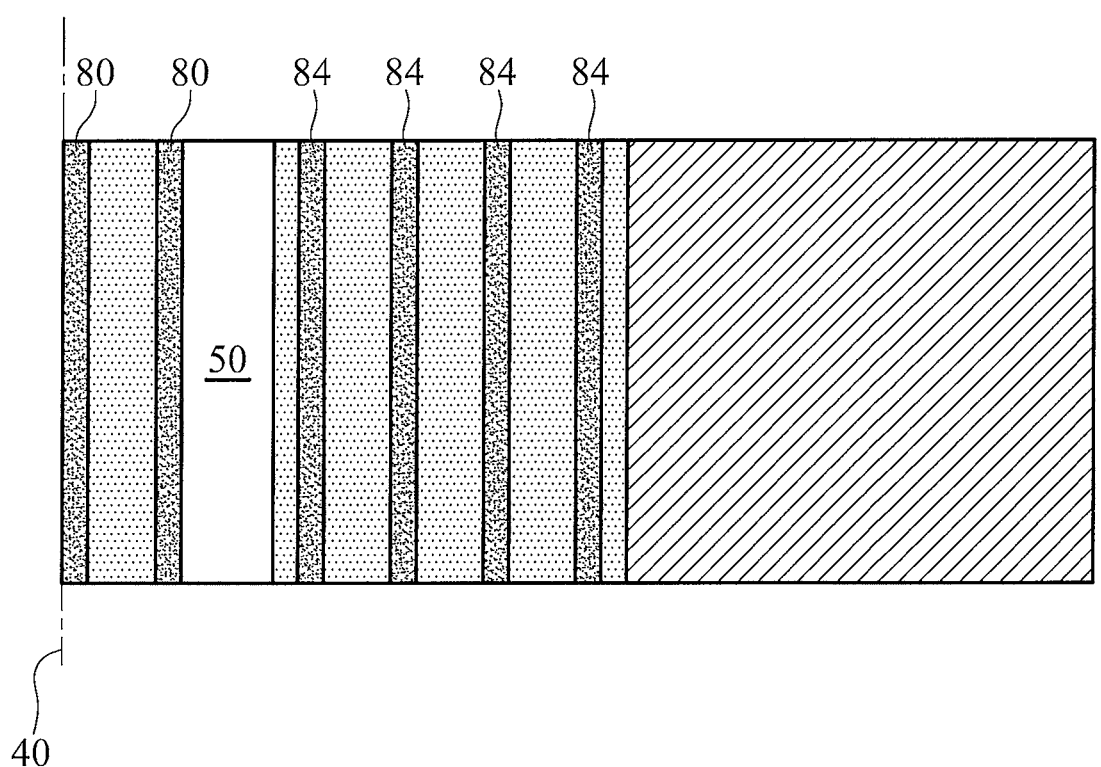

FIGS. 11A and 11B respectfully illustrate a cross-sectional view and a top view of a variation of the embodiment shown in FIGS. 10A and 10B, wherein seal rings 42 and 44 only include via bars in low-k dielectric layers 50. Referring to FIG. 11A, metal lines 58 and continuous via bars 60, which are formed in top dielectric layers 50, are essentially the same as shown in FIG. 10A. In low-k dielectric layers 50, via bars 80 and 84, each forming a ring, connect the respective overlying and underlying metal lines 46. Each of the via bars 80 and 84 has a width substantially less than a half of the width of the overlying/underlying metal lines 46. Low-k dielectric materials fill the spaces between via bars 80 and the spaces between via bars 84. In an embodiment, in each metallization layer, there are two via bars 80, each connected to an edge portion of metal lines 46. The optimum number of via bars 80 and 84 depends on the width of the metal lines 46, and may be determined by experiments to satisfy both the requirement for improving the mechanical strength of seal ring 44, and the requirement for improving the formation of via openings.

Figure 12:
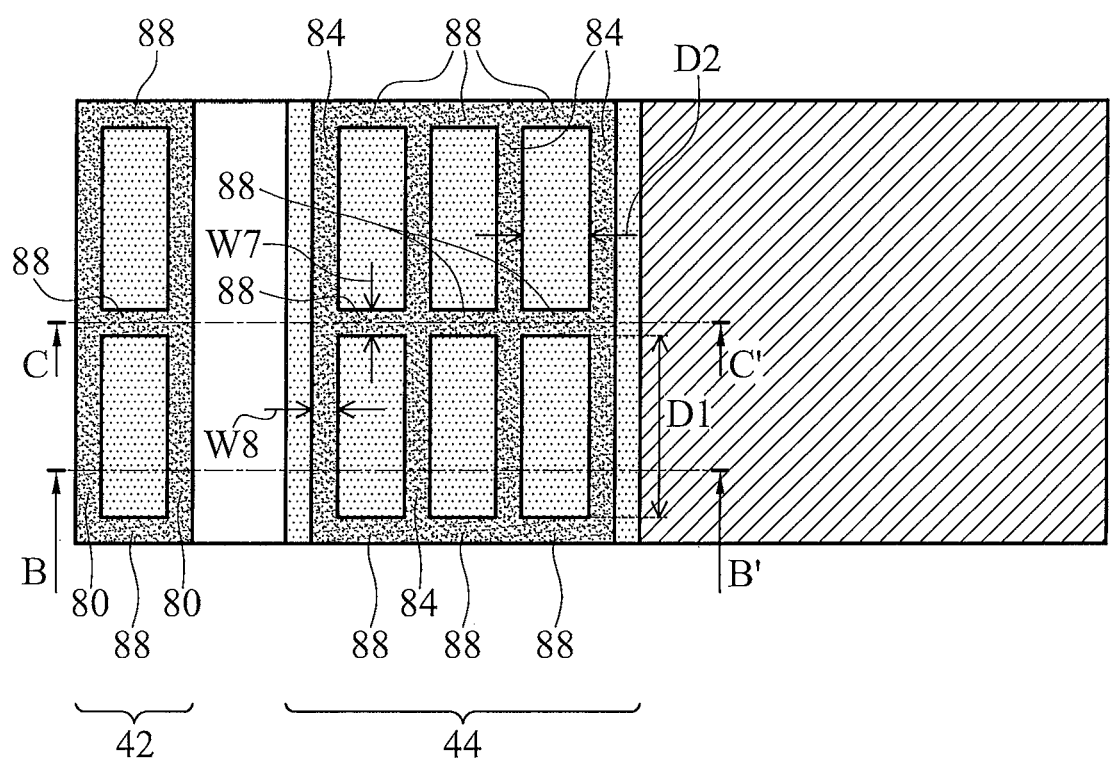
FIG. 12 illustrates seal rings having hybrid layouts in the higher layers and the lower layers, wherein the higher layers include continuous via bars, and the lower layers include thinner via bars interconnected by via buttresses.

The structures shown in FIGS. 11A and 11B may be reinforced, as shown in FIG. 12. The cross-sectional view of this embodiment is similar to what is shown in FIG. 11A. In this embodiment, metal lines 58 and continuous via bars 60 are essentially the same as shown in FIGS. 10A and 10B. Similar to the structure shown in FIGS. 11A and 11B, in low-k dielectric layers 50, via bars 80 and 84 are formed to connect the respective overlying and underlying metal lines 46. FIG. 12 is a top view, which shows via buttresses 88 formed between via bars 80 and 84. Via buttresses 88 are formed simultaneously as, and are seamlessly connected to, via bars 80 and 84. In an exemplary embodiment, a ratio of width W7 of via buttresses 88 to width W8 of via bars 84 is between about 0.8 and about 0.9, and more preferably equal to about one. A ratio of distance D1 between via buttresses 88 to distance D2 between via bars 80 (and/or via bars 84) is preferably between about 4 and about 5. Although the total area of via buttresses 88 is not significant compared to the total area of via bars 80 and 84, via buttresses 88 connect both vias 80 and via 84 as an integral structure, and hence causing a significantly improvement in the mechanical strength of seal rings 42 and 44.

Please note that if a cross-sectional view is taken along a plane crossing line B-B' in FIG. 12, the cross-sectional view is similar to what is shown in FIG. 11A. However, if a cross-sectional view is taken along a plane crossing line C-C' in FIG. 12, via buttresses 88 and via bars 80 and 84 will appear like a continuous via bar as shown in FIGS. 3A and 3B.

In alternative embodiments of the present invention, instead of having two top dielectric layers 52, a semiconductor chip may have only one dielectric layer 52. Accordingly, it is preferable that only the dielectric layer 52 includes continuous via bars, while the underlying low-k dielectric layers all include thinner via bars, which may be combined with discrete vias or via buttresses. In other embodiments, the schemes having discrete vias or via buttresses, and continuous via bars may be used in any of the top electric layers 52 and low-k dielectric layers 50, in any combination.

The embodiments of the present invention have improved ability for preventing cracks from propagating into circuit regions. Particularly, the enhanced protection schemes provide two-fold protection, one with a trench and one with a solid seal ring. Accordingly, the likelihood of the cracks propagating into circuit regions is significantly reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
a lower dielectric layer;
an upper dielectric layer over the lower dielectric layer; and
a first seal ring comprising:
  a first upper metal line in the upper dielectric layer;
  a first continuous via bar underlying and abutting the first upper metal line, wherein the first continuous via bar has a width substantially the same as the first upper metal line;
  a first lower metal line in the lower dielectric layer, the first lower metal line having a width substantially the same as the first upper metal line; and
  a first via bar and a second via bar each underlying and abutting the first lower metal line, an area between the first via bar and the second via bar being free from discrete vias.

2. The integrated circuit structure of claim 1, wherein the upper dielectric layer comprises un-doped silicate glass, and wherein the lower dielectric layer comprises a low-k dielectric material.

3. The integrated circuit structure of claim 1, wherein the upper dielectric layer is immediately over the lower dielectric layer, and wherein the first seal ring comprises a first portion over the upper dielectric layer and a second portion under the lower dielectric layer, and wherein all vias in the first portion are continuous via bars, and wherein the second portion is free from continuous via bars.

4. The integrated circuit structure of claim 1 further comprising:
an additional seal ring comprising:
  a second upper metal line in the upper dielectric layer;
  a second continuous via bar underlying and abutting the second upper metal line, wherein the second continuous via bar has a width substantially the same as the second upper metal line;
  a second lower metal line in the lower dielectric layer; and
  a third via bar underlying and abutting the second lower metal line.

5. The integrated circuit structure of claim 4 further comprising a plurality of discrete vias underlying and abutting the second lower metal line, wherein the plurality of discrete vias form a line parallel to a longitudinal direction of the second via bar.

6. The integrated circuit structure of claim 1 further comprising:
a first passivation layer over the upper dielectric layer;
a second passivation layer over and adjoining the first passivation layer; and
a trench extending from a top surface of the second passivation layer into the second passivation layer, wherein the trench substantially forms a ring.

7. An integrated circuit structure comprising:
a semiconductor chip comprising a plurality of dielectric layers, wherein the plurality of dielectric layers comprise:
  a plurality of low-k dielectric layers; and
  a top dielectric layer over the plurality of low-k dielectric layers, wherein the top dielectric layer has a k value greater than k values of the plurality of low-k dielectric layers; and
a first seal ring comprising:
  a first top metal line in the top dielectric layer;
  a first continuous via bar underlying and abutting the first top metal line, wherein the first continuous via bar has a width substantially the same as the first top metal line;
  a plurality of metal lines substantially aligned to each other, wherein each of the plurality of metal lines is in one of the plurality of low-k dielectric layers; and
  a plurality of vias underlying and abutting each of the plurality of metal lines, wherein the plurality of vias comprise:
    a first and a second via bar, each forming a ring, a space between the first via bar and the second via bar being free from a discrete via; and
    a low-k dielectric material between the first and the second via bar.

8. The integrated circuit structure of claim 7 further comprising:
an additional top dielectric layer between the top dielectric layer and the plurality of low-k dielectric layers, wherein the first seal ring further comprises:
  an additional top metal line in the additional top dielectric layer; and
  an additional continuous via bar underlying and abutting the additional top metal line, wherein the additional continuous via bar has a width greater than about 70 percent of a width of the additional top metal line.

9. The integrated circuit structure of claim 7 further comprising:
a first passivation layer over the top dielectric layer;
a second passivation layer over and adjoining the first passivation layer; and
a trench extending from a top surface of the second passivation layer into the first passivation layer, wherein the trench substantially forms a ring.

10. An integrated circuit structure comprising:
a lower dielectric layer;
an upper dielectric layer over the lower dielectric layer, wherein the upper dielectric layer has a greater k value than the lower dielectric layer; and
a seal ring comprising:
  an upper metal line in the upper dielectric layer;
  a continuous via bar underlying and abutting the upper metal line, wherein the continuous via bar has a width substantially the same as the upper metal line;
  a lower metal line in the lower dielectric layer;

a plurality of vias underlying and abutting the lower metal line, wherein the plurality of vias comprises:
a via bar; and
a plurality of discrete vias spaced apart from each other, wherein the plurality of discrete vias forms a line parallel to the via bar.

11. The integrated circuit structure of claim 10 further comprising an additional via bar adjacent to an opposite edge of the lower metal line than the via bar, wherein the additional via bar is parallel to the via bar, and wherein the plurality of discrete vias is between the via bar and the additional via bar.

12. The integrated circuit structure of claim 11 further comprising a plurality of additional discrete vias between the via bar and the additional via bar, wherein the additional plurality of discrete vias forms an additional line parallel to the via bar.

13. The integrated circuit structure of claim 10, wherein the integrated circuit structure is in a semiconductor chip, and wherein the via bar and the line formed of the plurality of discrete vias each extends along and adjacent edges of the semiconductor chip and forms a ring.

* * * * *